United States Patent [19]
Burgess et al.

[11] Patent Number: 5,970,774
[45] Date of Patent: Oct. 26, 1999

[54] APPARATUS AND METHOD FOR CORNER CUTTING AND EDGE BENDING OF LITHOGRAPHIC PLATES

[75] Inventors: Dennis M. Burgess; William J. Campbell, both of Minnetonka; Mark L. Palmer, Burnsville, all of Minn.

[73] Assignee: Burgess Industries, Inc., Plymouth, Minn.

[21] Appl. No.: 09/079,866

[22] Filed: May 15, 1998

[51] Int. Cl.⁶ ..................................................... B21D 5/04
[52] U.S. Cl. ............................................... 72/294; 72/319
[58] Field of Search ............................. 72/319, 294, 320

[56] References Cited

U.S. PATENT DOCUMENTS

| Re. 31,938 | 7/1985 | Klukow ..................................... 72/387 |
| 3,191,419 | 6/1965 | Rippe ........................................ 72/294 |
| 3,771,440 | 11/1973 | Eburn ........................................ 72/294 |
| 4,178,097 | 12/1979 | Sara .......................................... 355/100 |
| 4,489,652 | 12/1984 | Takeuchi et al. ........................ 101/211 |
| 5,255,607 | 10/1993 | Nishiyama et al. ................. 101/463.1 |
| 5,257,444 | 11/1993 | Nishiyama et al. .................... 29/33 H |
| 5,259,230 | 11/1993 | Beyers ....................................... 72/294 |
| 5,454,247 | 10/1995 | Powers et al. ............................. 72/37 |
| 5,502,993 | 4/1996 | Powers et al. ............................. 72/37 |

FOREIGN PATENT DOCUMENTS 2 422 456  9/1979  France.

*Primary Examiner*—Daniel C. Crane
*Attorney, Agent, or Firm*—Gray Plant Mooty Mooty & Bennett, P.A.; Malcom D. Reid, Esq.

[57] ABSTRACT

An apparatus and a method configure lithographic plates by cutting corners and bending edges in preparation for use in web offset printing. The lithographic plate is precisely aligned and immobilized on a support bed, which has bending anvils at opposing edges of the bed. A corner die cutter advances into position above a corner of the plate, cuts a corner of the plate and then retracts. An eccentric camming member for bending the plate edges has full bearing supporting ends and additional bearings intermediate the ends. The eccentric camming members lower to the plate and rotate within their bearings to form bends of selected angles in opposing edges of the plate. The eccentric camming members are then counter rotated and raised to their position above the plate. The movements of the corner die cutter and the eccentric camming member are precisely sequenced with each other by programmable logic control.

53 Claims, 6 Drawing Sheets

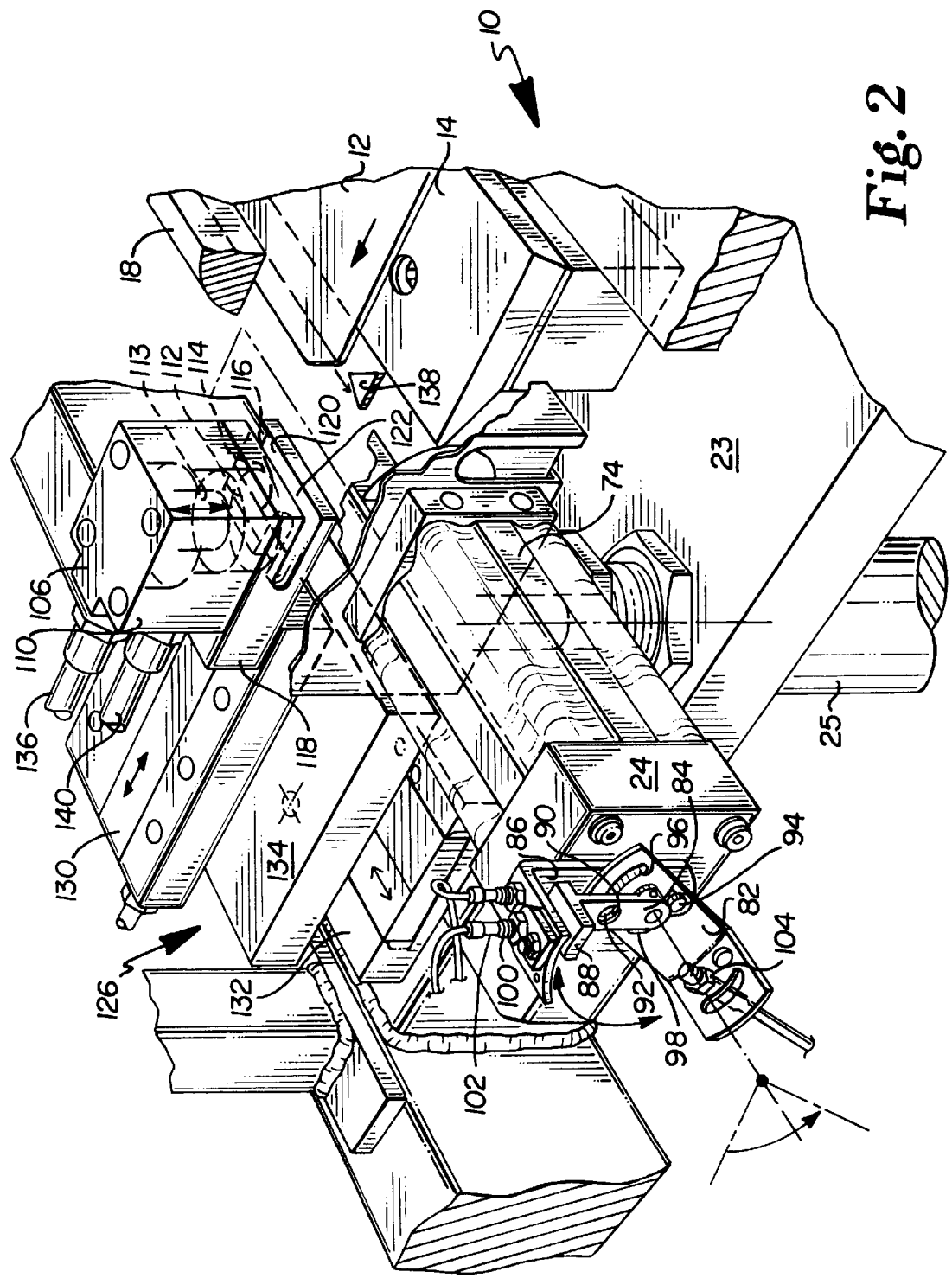

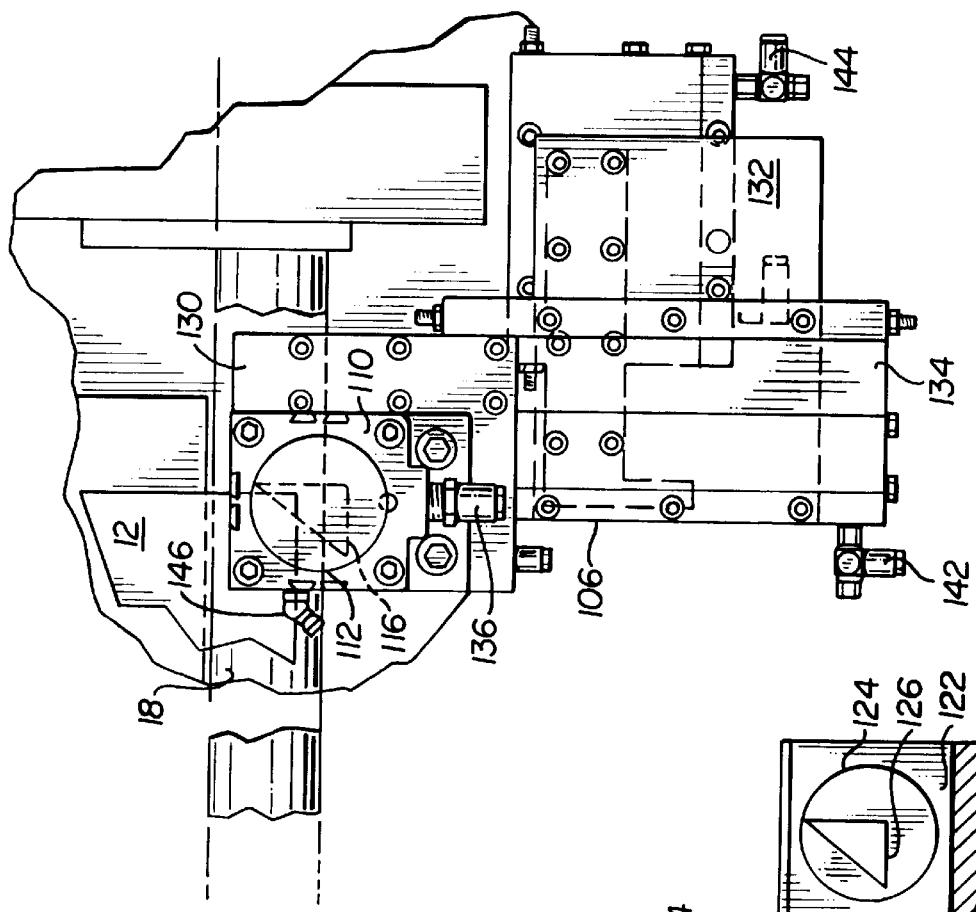
Fig. 4
Fig. 8
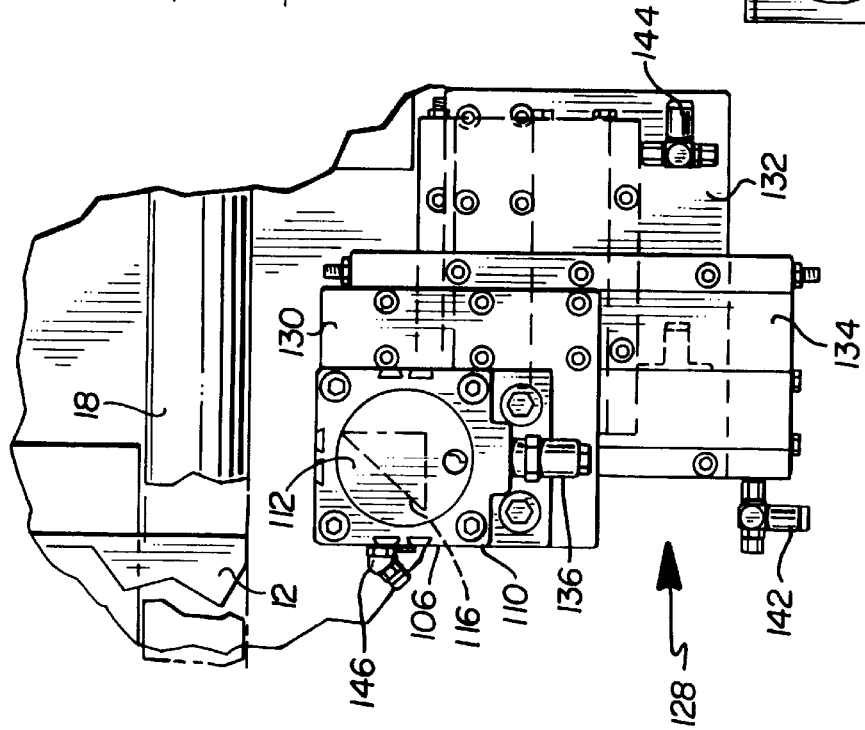
Fig. 3

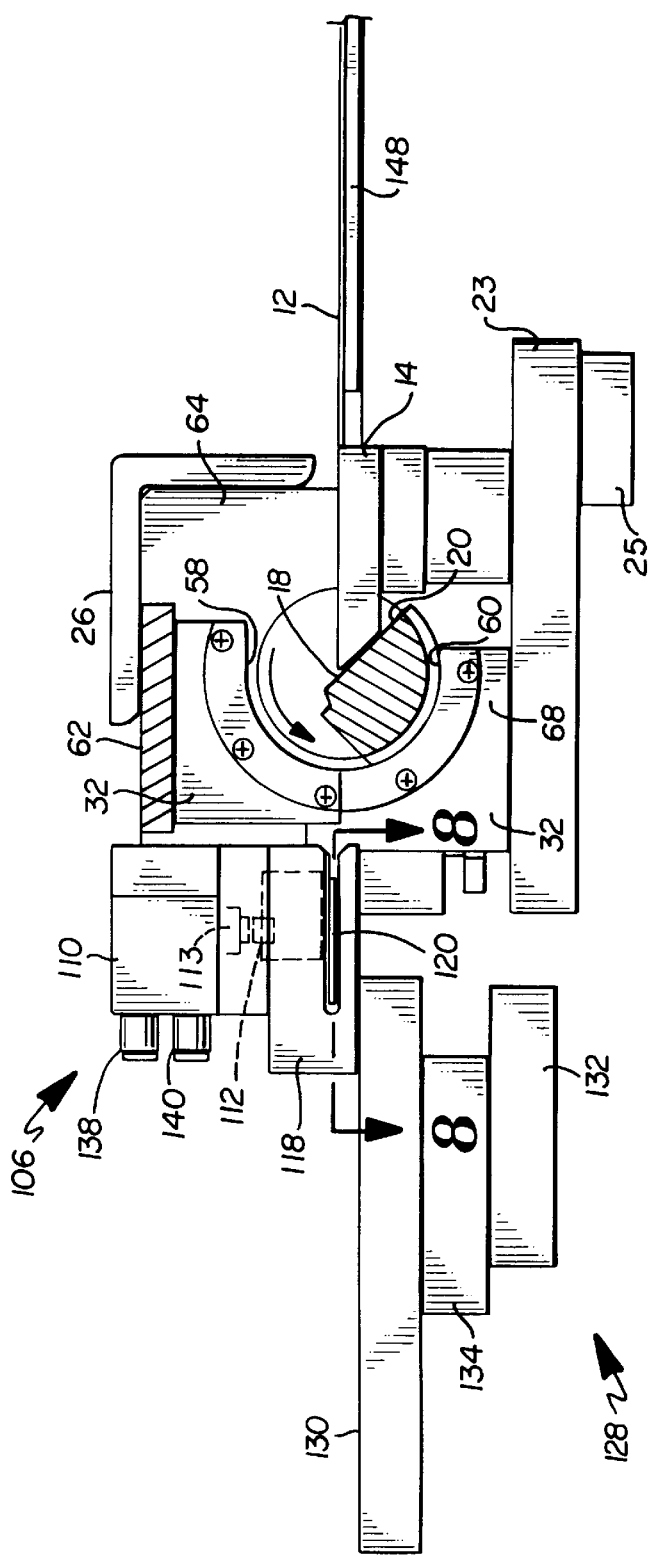
Fig. 7
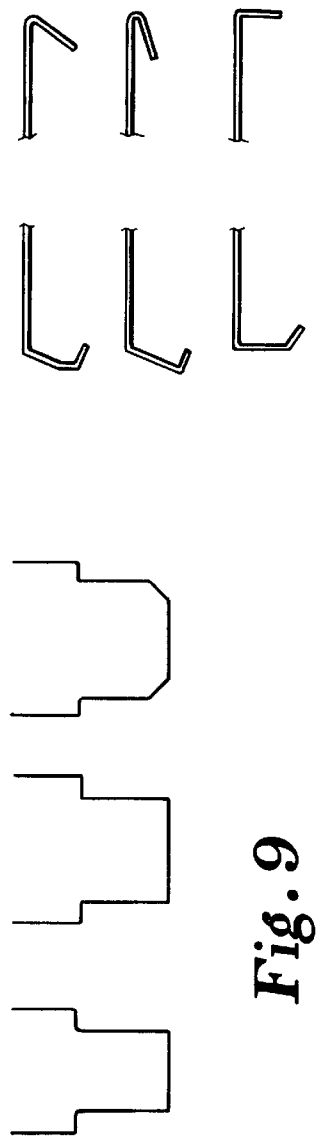
Fig. 10
Fig. 9

APPARATUS AND METHOD FOR CORNER CUTTING AND EDGE BENDING OF LITHOGRAPHIC PLATES

FIELD OF THE INVENTION

This invention relates to an apparatus for preparing lithographic plates for attachment to a printing cylinder. More specifically, this invention provides a machine press having precisely sequenced operating elements to make pre-defined cuts at a perimeter of a flat lithographic plate and to then bend opposite parallel edges of the lithographic plate to pre-defined desired bend angles. The configured plates can then be precisely aligned in subsequent attachment of the plate to a printing cylinder. Also provided by this invention is a process of configuring a lithographic plate for attachment to a printing cylinder by making pre-defined cuts at a perimeter of a flat lithographic plate and then bending opposite parallel edges of the plate to a pre-defined bend angle.

BACKGROUND OF THE INVENTION

As described in U.S. Pat. No. Re. 31,938, reissued Jul. 9, 1985 to Roger Klukow and assigned to the present assignee, web offset printing and production requires precision bending of lithographic plates to assure precise alignment of the images on the plates and longevity of the plates. Klukow describes a precision machine tool to position accurately and bend replicate lithographic plates in precise alignment with each other. According to the bending fixture described by Klukow, bends in the lithographic plate are created by rolling the metal around anvils at edges of a supporting bed using eccentric camming members. These camming members are supported throughout their length by a plurality of bearings, which provide effective control of the bending operation. The disclosure of the Klukow patent is completely and specifically incorporated herein by reference.

Prepunching of the plates with a precision register punch before positioning on the Klukow plate bending fixture assures that the image registration will be exactly positioned when the plate is bent. The plate is inserted onto the bed of the fixture and rides on an air cushion generated through the bed. Limit switches allow positioning of the plate, which is then aligned with registration pins in the support bed for proper registration of the plate and image for forming of the bend. Positioning of the plate with the aid of the limit switches and registration pins assures perfect alignment of the image on the plate relative to the formed bends.

Once the plate has been properly aligned on the Klukow bending fixture, reversal of air pressure immobilizes the plate on the table with vacuum pressure. The registration pins are retracted and the plate ends are clamped to position the plate precisely for bend forming. The eccentric camming members are precisely aligned to the radius of the anvil around which the bend is to be formed and to the exact thickness of the lithographic plate to be bent. The Klukow bending fixture uses a plurality of bearings to support each eccentric camming member throughout its length. This arrangement assures straightness of the bend and parallelism of the bends on the opposing edges of the plate and alignment of the image to each bend. The upper bearings lower each camming member to the plate, clamping the plate to the table. Each camming member rolls the lithographic plate around the anvil to form the bend. This assures that the plate remains of uniform thickness throughout, including the areas of the formed bends, thus avoiding any mechanical stress.

After formation of the bend with the Klukow bending fixture, each camming member is counter rotated to its original position on the plate. The retractable anvil withdraws laterally from the bend edge, the upper bearings raise the eccentric camming member, and the plate is removed from the Klukow fixture. The formed plate has a uniform thickness over its entire area, including the length of the bend, with minimum distortion of the plate.

Despite the apparent advantages of the Klukow fixture, it can only prepare lithographic plates bent to the angle of the bending radius of the anvil edge. However, printing presses manufactured by different companies have lithographic plate receiving slots that extend into the printing press cylinder at angles different than those of other manufacturers. This requires the printer to either have multiple benders each with an anvil unique to the printing press on which the lithographic plate is to be mounted or to remove and r place the anvils each time a lithographic plate is to be bent for a different printing press. In the first case, the extra bender is an expensive investment and in the second case the removal and replacement of the anvils on a bender is a time consuming and, therefore, costly procedure. So having a single bender capable of preparing bends at multiple angles for easy and accurate attachment of the plates into the receiving slots of a printing cylinder would be desirable. It is also desirable to have a bender capable of easy and efficient adjustment of the bend angle because it is not unusual to have a press cylinder that requires one angle of bend on one edge of the plate and another on a second edge of the plate. And each of these bends may vary from one manufacturer to another. This requires that the angle of the leading edge of the plate bender be adjustable independently of the trailing edge.

It is also known that sharp end corners of the bend can sometimes bind or crimp during installation of the bent plate into the slots in the printing cylinder. This impedes proper and efficient positioning of the plate about the cylinder. Cutting off the sharp end corners of the lithographic plate before bending allows the plate to be more easily mounted onto the printing press cylinder. Corner cuts of this type are generally low tolerance and can be cut at any angle in one or more corners of the printing plate. These corner cuts also provide clearance for obstructions internal to the printing plate cylinder. Incorporating corner cutters into the plate bending operation in a single apparatus would reduce the time and number of equipment pieces needed to produce a printing plate ready to mount to the printing press cylinder. Before bending, other selected shapes may be cut either from the corners or from along the plate edge to be bent. These cut-out shapes configure the plate to match various alignment and locking features on the printing cylinder, typical cut-out shapes are shown in FIG. 9.

Until recently, such corner cutters have been part of the printing plate punching operation. The punching operation had been used to control registration of the image on the printing plate and to cut plate corners for precise mounting onto the printing press cylinder. With the introduction of computer control of plate imaging, the printing plate punching operation is no longer used, but corner cutting of the printing plate is still required. Corner cutting assures the lateral alignment of the printing plate on the printing cylinder of the printing press. Correct plate alignment throughout the entire printing press will speed start-up time considerably resulting in reduction of high start-up costs. These corner and edge cuts must be controlled to a high tolerance to assure correct alignment to the image applied to the printing plate. Depending on the design of the printing cylinder, one or more of the printing plate corners may need to be precisely cut. The corner cuts usually fit into or along side of a block or edge of the printing cylinder and can assume a variety of sizes and shapes, to align with specific printing cylinder, including triangular and rectangular shapes.

World-wide, there are many manufacturers of different printing presses, each requiring a particular size, shape, or angle of bend or of corner or edge cut to mount and hold the printing plate to the printing press cylinder. Printing plate manufacturers use a variety of different materials and processes to manufacture printing plates. Typically, plates may be made of metal, such as steel or aluminum, or of synthetic photographic plate materials. The bending and springback characteristics of these materials vary, and it is generally necessary to over-bend the plate, so that the proper desired angle bend is attained after allowed material spring back.

Accordingly, there is a need for an apparatus and a method to form lithographic plate bends of different chosen angles. A need also exists for an apparatus and a method for preparing lithographic plates that will incorporate removal of the lithographic plate's sharp end corners during bending of the lithographic plate.

A cut along a perimeter of the plate is meant to include a corner cut of one to four corners of the plate, as well as cut-out shapes along opposite edges of the plate, that is the edges to be bent in the bending operation.

BRIEF DESCRIPTION OF THE INVENTION

According to this invention, a plate configuring apparatus prepares a metal lithographic plate having cut corners and precisely bent edges. The apparatus has a bed to support the plate to be configured, a corner die cutter to form a cut along a perimeter of the plate and an eccentric camming member to bend an edge of the plate. The corner die cutter advances and retracts to and from a position above a corner of the plate, and cuts a corner of the plate when in an advanced position above the plate corner. When the corner die cutter is in position above a corner of the plate, the cutter precisely fits within a vertical space between the raised eccentric camming member and the plate.

At the edge of the bed is an anvil with a bending radius. The eccentric camming member has a bending surface positioned relative to the anvil to bend a plate edge around the anvil bending radius. The eccentric camming member has full bearing supporting its ends and an additional bearing intermediate the ends within which the eccentric camming member is rotatably contained and radially supported during rotation. A closest point on the bending surface of the eccentric camming member is spaced from the anvil during rotation a distance equal to a thickness of the plate, so that the plate maintains an even thickness throughout, including the bend. The eccentric camming member may be adjustable to limit its rotation around the bending radius of the anvil to bend the plate edge to any angle greater than 0° and the anvil angle. The advancement, cutting, and retraction of the corner die cutter and the lowering, rotation, counter rotation, and raising of the eccentric camming member are precisely sequenced and may be computerized. Thus, the advancement, cutting, and retraction operations of the corner die cutter are complete before the eccentric camming member begins its sequence of operation. Advancement and retraction of the corner die cutter, corner die cutting, raising and lowering of the upper bearing mount, and the rotation and counter rotation of the eccentric camming member may be pneumatically, hydraulically, or electrically operated. In fact, the motive force for any required motion of the bender may be pneumatic, hydraulic, or electrical. The eccentric camming member may be rotated and counter rotated by a rotary orbit motor. The preferred apparatus has a bed with bending anvils at opposing edges to support the plate to be configured, as many die cutters as may be necessary to make the corner or edge cuts, and a pair of eccentric camming members for bending opposing edges of the plate.

This invention is also directed to a method for configuring a lithographic plate that has corners and edges. The method includes positioning the plate on a support bed, cutting the plate corners or edges, and bending the plate edges. The bed has an anvil with a bending radius of a preselected angle at an edge of the bed. A die cutter is advanced to a position above a corner or edge of the plate, actuated to cut a corner from the plate, and then retracted from its position above the plate. The die cutter is sized and shaped to fit precisely within a vertical elevation between the raised eccentric camming member and the support bed. The eccentric camming member has a bending surface and is positioned relative to the anvil for bending a plate edge around the bending radius of the anvil. Full bearings support ends of the eccentric camming member and additional bearings are intermediate ends of the eccentric camming member, within which the camming member is rotatably contained during rotation and supported radially along its length. The camming member rotates around the bending radius of the anvil. During rotation, a closest point on the bending surface of the eccentric camming member is spaced from the anvil a distance equal to a thickness of the plate. The additional bearing may have an upper bearing carried by an upper bearing mount and a lower bearing carried by a lower bearing mount secured to the bed. Before rotating the eccentric camming member, the upper bearing mount is lowered to a position relative to the anvil for bending a plate. After bending the plate, the eccentric camming member is counter rotated and the upper bearing mount of the eccentric camming member is raised. The camming member may be adjusted to bend the plate around the anvil to an angle greater than 0° and the anvil angle. A preferred method according to this invention includes cutting one to four corners, optionally making cuts along the plate edges to be bent, and bending opposing edges of the plate. In the preferred method, two anvils are provided at opposing ends of the bed, with an eccentric camming member operatively associated with each anvil, so that opposing edges of the plate are each rotated and bent around the anvil, each to an angle greater than 0° and the anvil angle. One anvil may be retracted for removal of the configured plate from the bed.

BRIEF DESCRIPTION OF THE DRAWINGS

FIG. 2 is an enlarged cut-away detail view of a corner die cutter in a fully retracted position relative to the lithographic plate, plate bend selector apparatus, and an eccentric camming member in a lowered position relative to the plate and the anvil.

FIG. 3 is a plan view of a corner die cutter fully retracted from a corner of a lithographic plate.

FIG. 4 is a plan view, similar to FIG. 3, of the corner die cutter advanced along X and Y axes to a position over a corner of a lithographic plate preparatory to cutting a corner.

FIG. 7 is an enlarged detail view, similar to FIGS. 5 and 6, showing the eccentric camming member in the lowered and fully rotated bend position.

FIG. 8 is a plan showing a top view of the corner cutter punch body.

FIG. 9 illustrates various sizes and shapes of edge cuts that can be cut with the present apparatus.

FIG. 10 illustrates profiles of various edge bonds that can be formed with the present apparatus.

DETAILED DESCRIPTION OF THE INVENTION

Figure 1:
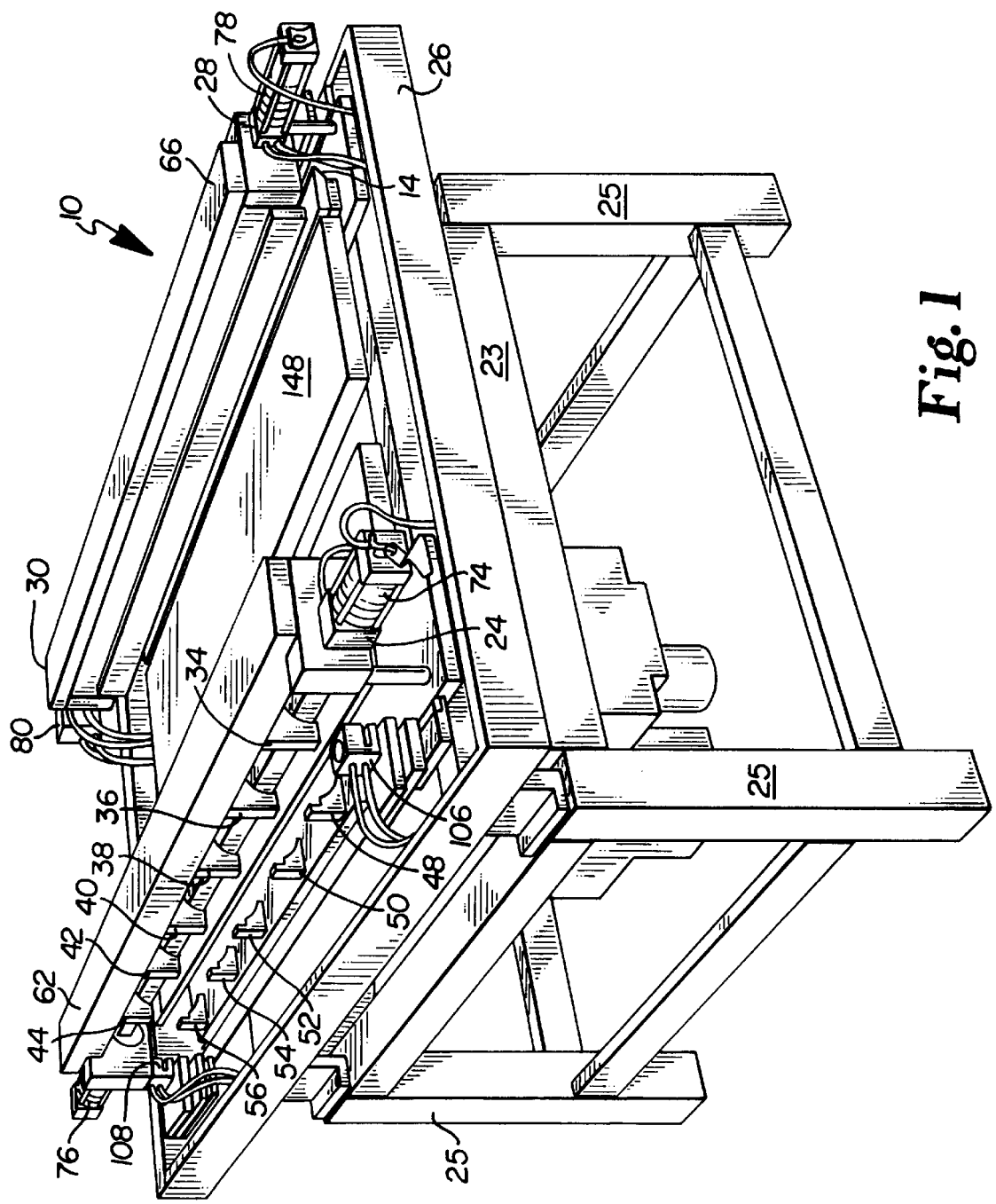
FIG. 1 is a pictorial perspective view of the apparatus of this invention, taken from a front left corner with the corner die cutters retracted and the eccentric camming members raised to accept a lithographic plate.

The apparatus 10 for cutting corners or edges and for bending opposite edges of lithographic plates 12 is seen, for example, in FIGS. 1 and 2. FIG. 1 is a pictorial perspective view of the apparatus 10 taken from a front left corner. Shown are die cutters 106, 108 fully retracted and eccentric camming members, one of which is shown at 18, in the fully raised position to accept a lithographic plate 12 on the support table 26. The support table 26 is constructed of heavy structural steel to provide a solid support for the apparatus 10. The saddle 23 and legs 25 are the substructure for the support table 26, the corner die cutters 106, 108 and eccentric camming members 18.

The basic operative elements of the apparatus 10 are generally shown in FIGS. 1 and 2 and are shown in the details of a method of operation of the apparatus in FIGS. 3–7. The plate 12 is positioned on the support table 26 during cutting and bending. The support table 26 of the apparatus 10 has a hardened anvil 14, 16 on opposing table edges. As seen, for example, in FIG. 1, one anvil 16 is retractable for ease of removal of the plate 12 after it has been configured by corner cutting and edge bending. The construction and operation of the features of the apparatus 10 for registering, positioning, and securing the plate 12 onto the support table 26 during the cutting and bending operations are described in the Klukow patent, incorporated herein by reference. The anvils 14, 16, as described in Klukow, are hardened and have a ground radius with controlled tolerance required for proper bending of plates 12. Cost and material reduction in construction of the anvils 14, 16 can be obtained by increasing the length of the bevel forming the anvil bending edge, thus decreasing the size of the anvil edge and also by constructing the anvil of thinner stock than, for example, the anvil shown and described in the Klukow patent. As shown, the anvils are oriented with the beveled surface facing toward the lithographic plate to be bent. However, if required for a particular bend orientation, the anvils may be removed and reversed, so that the beveled surface is facing toward the lithographic plate 12.

The structure and operation of the corner cutting features of the apparatus and method of this invention will be described with reference to FIGS. 1–8. The corner die cutters 106, 108 can perhaps best be seen in FIGS. 1, 2, 3 and 6, in which they are fully retracted from the support table 26 and from over corners of the plate 12. Each corner die cutter 106, 108 is constructed with an upper retaining block 110 journaled to receive and retain an air cylinder 112. The air cylinder 112 is vertically reciprocal along a Z axis by means of a hydraulic piston 113, shown in phantom in FIG. 2. A commercially available part defined as a pancake air cylinder includes both the retaining block 110 and the air cylinder 112 and is readily commercially available for example from Bimba Manufacturing Company of Monee, Ill., suitably as identified by part #EF-5010-E. On the bottom surface 114 of the air cylinder 12 is affixed a triangular shaped cutting plate 116. The upper retaining block 110 is attached to plate receiving block 118, shaped with a plate receiving slot 120. The slot 120 has a vertical gap of sufficient height to receive the corner of a plate 12. On the lower face 122 of the receiving slot 120 is a circular receiving recess 124 with a further recessed triangular receiving recess 126, as shown in FIG. 8. The triangular receiving recess 126 and circular recess 124 together are sized and shaped to receive the plunger 112 and the triangular shaped cutter 116 closely. If needed, the triangular receiving recess 126 may be a through hole, to allow the cut corner 138 of the plate 12 to fall through, as will be described in detail further herein. It will be understood that the cutter 116 can be of any other suitable shape to prepare appropriate corner cuts required by the specific printing cylinder to which the lithographic plate will later be attached. Also, as has been described above, die cutters may be positioned along opposite edges of the plate that is the edges to be bent in the bending operation, in order to form cut-out shapes along these edges as may be required for locating and securing the lithographic plate to a particular printing cylinder. For forming these edge cuts, the cutter 116 may be of the sizes and shapes shown with reference to FIG. 9.

The punch body 118 is mounted on a low profile slide table assembly 128, which is horizontally movable along X and Y axes in planes parallel to the plane of the support table 26 and the plate 12. Thus, as can be seen in FIGS. 1–8, the punch body 118 is mounted on a Y axis table 130, which is separated from an X axis table 132 by an intermediate table 134. The lower face of the Y axis table 130 is movable along a Y axis with respect to the upper face of the intermediate table 134. The upper face of the X axis table 132 is movable along an X axis with respect to the lower face of the intermediate table 134. The lower face of the X-axis lower slide table 132 is fastened to the saddle 23. It will be, of course, recognized by those of skill in this art that such slide table assemblies 128, movable with respect to each other along two mutually perpendicular axes, are well known in the art. Suitable assemblies for use in the apparatus and method of this invention are available, for example, from SMC Corporation under the trade name Low Profile Slide Table, Series MXF.

Figure 5:
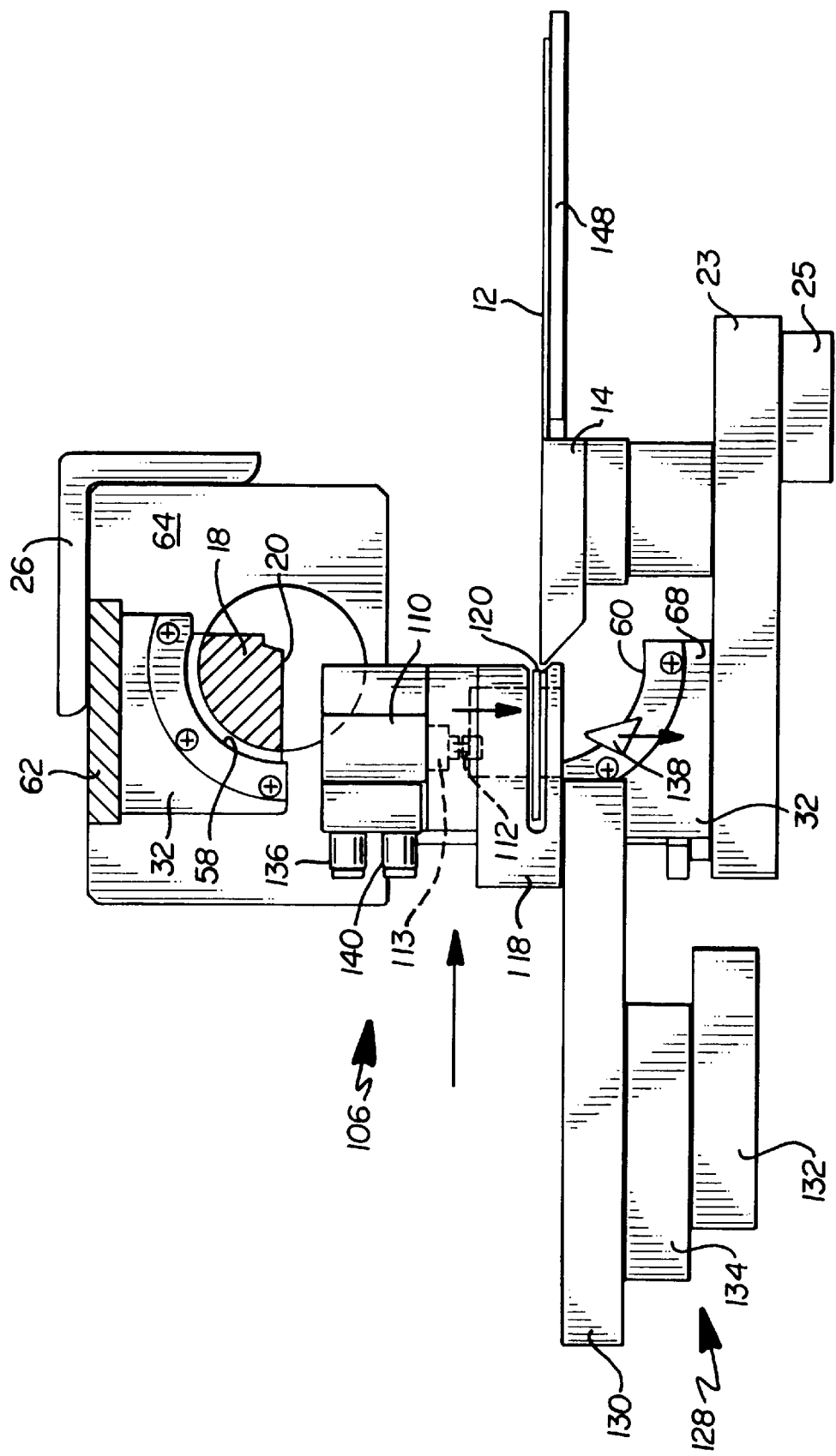
FIG. 5 is an enlarged detail view of a corner die cutter (in the position of FIG. 4) over the lithographic plate corner, having completed the corner cut and showing a corner fragment falling away.

As shown in FIG. 3, the Y axis table 130 moves the die cutter assembly 106 toward the eccentric camming member 18. The eccentric camming member 18 is in its fully counter rotated and fully raised position relative to the support table 26 and the plate 12 (to be described further with reference to the Klukow patent). As seen in FIG. 4, the X axis table 132 moves the die cutter assembly 106 until the corner of the plate 12, which extends over the edge of the anvil 14, is received within the receiving slot 120. In this position, the triangular shaped cutter 116 is over the portion of the plate 12 corner to be cut off. As can be seen in FIG. 5, the die cutter assembly 106 closely fits within the vertical height space beneath the bending surface 20 of the counter rotated and raised camming member 18 and the support table 26. FIG. 5 also shows the eccentric camming member 18 in its fully counter rotated and fully raised position. Typically, the triangular shaped cutter 116 will be larger than the largest corner to be cut from a plate 12. Thus, with proper positioning of the die cutter assembly 106 by means of the slide table assembly 128, a corner cut of the exact desired dimensions may be made.

With the die cutter assembly 106 in the position shown in FIG. 5, the plunger 112 is urged downward by hydraulic pressure to the piston 113 through the upper port 138. The triangular shaped cutter 116 grasps the corner of the plate 12 against the edge of the triangular shaped receiving recess 126. Continuing downward pressure of the plunger 112 precisely and cleanly severs the desired corner cut 138, which falls away. The plunger 112 is urged upward by hydraulic pressure on the piston 113 through the lower port 140. Having completed the cut, the slide table assembly 128 withdraws the die cutter assembly 106 along the X and Y axes, until it is fully retracted from the plate 12 and the eccentric camming member 18. The slide table assembly 128 typically operates by pneumatic pressure. The ports 142, 144 are quick-connect/disconnect fittings for attachment to a source of pneumatic pressure, not shown. The angled fitting 146 is for introducing needed lubricant for the slide table assembly 128.

The eccentric camming members 18, which roll the plate 12 edges around the anvils 14, 16, are also machined to exact tolerances and hardened. Each camming member 18 is rotatably secured at each end, preferably within full OILITE™ bearings (not shown) in steel end casings 24, 26 and 28, 30. Each eccentric camming member 18 is also fully supported throughout by a plurality of split bearings 32. OILITE™ bearings are manufactured by Beemer Precision, Inc. of Fort Washington, Pa. As can be seen in FIG. 1, six upper split bearings 34, 36, 38, 40, 42, 44 and six lower split bearings 46, 48, 50, 52, 54, 56 are positioned between the ends of each camming member 18, respectively. Four to six bearings 32 are preferably used, depending on the size of the plates 12 to be configured. For the largest plates 12, additional bearings 32 can be used and additional reinforcement (not shown) can be added in the center of the camming members 18.

The apparatus 10 of this invention can be made to accommodate lithographic plates of different dimensions. Such an apparatus includes the existing components as previously described which support the plate 12, the die cutter assemblies 106, and the eccentric camming members 18. A set of linear bearing is mounted below one of the saddle 23 assemblies to allow that saddle assembly to move laterally toward and away from a stationary saddle at the opposite side of the apparatus. Adjustment of the movable saddle by means of the linear bearings is accomplished by an operator controlled electric, hydraulic or pneumatic actuator which can precisely control the distance between the bending anvils. Lateral adjustment of the movable saddle can also allow easy removal of the lithographic plate after the edge bend operation.

Figure 6:
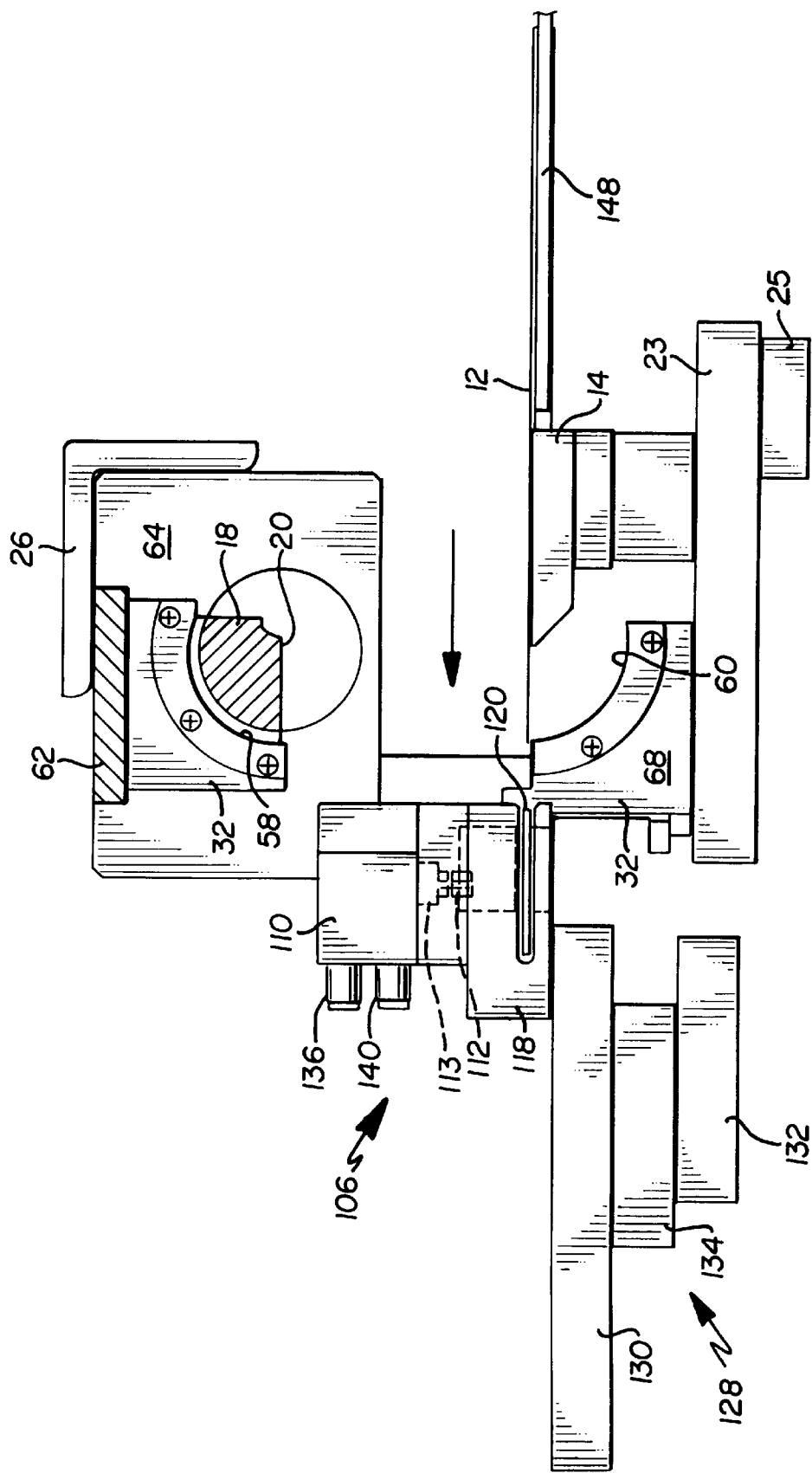
FIG. 6 is an enlarged detail view, similar to FIG. 5, showing the corner die cutter fully retracted from the lithographic plate and the eccentric camming member in the raised position over the corner-cut plate.

As can perhaps best be seen in FIGS. 5–7, each of the plurality of split bearings 32 consists of a split OILITE™ bearing surface 58, 60, with each portion supported in upper and lower bearing mounts 64, 68, respectively. The lower bearing mounts 68 are fully integrated into the support 26, of which the anvils 14, 16 are a part. The upper bearing mounts 64 slidably lower to engage the lower bearing mounts 68, so that when bending pressures are applied, the bearing mounts 64, 68 do not slip or move relative to each other. For added strength, the upper bearing mounts 64 are secured to solid steel header bars 62, 66.

After the plate 12 is precisely aligned on the table 26, as described in the Klukow patent, the plate 12 is immobilized. Vacuum clamping engages the plate 12 hydraulically upon slidingly lowering the upper bearing mounts 64 to contact and engage the lower bearing mounts 68, as fully described in Klukow. After that, the eccentric camming members 18 rotate with four rotary orbit motors 74, 76, 78, 80, one at each end of each eccentric camming member 18.

Rotation of the eccentric camming members 18 may also be actuated by the rack opinion mechanism described in the earlier Klukow patent, or by any other suitable mechanism.

As a distinct improvement over the structure and operation of the Web Bending Fixture of Klukow, the present apparatus 10 can configure the plate 12 bends to any angle between the angle of the bending radius of the anvil 14, 16 and less than 180°. The angle of each bend can be precisely and independently chosen as needed. As can perhaps best be seen in FIG. 2, a plate bend angle limiter 82 is adjustably secured to the end casing 24 about a pivot 84. The pivot 84 also secures a magnetic sensor support 86 and a pivoting hammer 88. The pivot 84 and the hammer 88 rotate with the rotary orbit motor 74, retained within the end casing 24, and with the rotation of the eccentric camming member 18. The magnetic sensor support 86 remains stationary. The position of the plate bend angle limiter 82 is determined by the position of set screws 92, 169 in arc slots 96, 98. The set screw 92 is reached through an access hole 90 through the pivoting hammer 88. The position of the plate bend angle limiter 82 can be rotatably adjusted by loosening the set screws 92, 94. The position of the angle limiter 82 determines the extent to which the hammer 88, and thus the camming member 18, will be rotated by the rotary orbit motor 74. This adjustment determines the angle of the bend that will be formed in the plate 12. Once the desired position of the plate bend angle limiter 82 has been established, the set screws 92, 94 are tightened in the arc slots 96, 98, respectively.

As can be understood with reference to FIG. 2, the switch actuator 88 will rotate counter-clockwise when the eccentric camming member 18 is rotated to bend the plate 12. Then, the switch actuator 88 will rotate clockwise when the eccentric camming member 18 is counter rotated to release the plate 12 after the completed bending operation. As shown in FIG. 2, the switch actuator 88 and the eccentric camming member 18 are lowered over the plate 12 in position to begin a bending operation, which is controlled by programmable logic control (PLC) using a plurality of magnetic proximity sensors 100, 102, 104. At this point, the hammer 88 is adjacent a first magnetic proximity sensor 100, which emits a PLC recognizable signal of the position of the actuator switch 88 ready to begin the bending operation. As the switch actuator 88 and the eccentric camming member 18 begin to rotate counter-clockwise, the switch actuator 88 passes a second magnetic proximity sensor 102, which emits a PLC recognizable signal showing the location of the actuator switch 88. When the switch actuator 88 and the eccentric camming member 18 complete the extent of their rotation, as limited by the angle limiter 82, the switch actuator 88 contacts a third magnetic proximity sensor 104. The third magnetic proximity sensor 104 emits a PLC recognizable signal that the bending operation is complete (as also shown in FIG. 7). Additional proximity sensors may be positioned as desired to control the bend of the angle. Rotation can be stopped by computerized control at a selected proximity sensor to thereby define the required angle of bend. To release the bent plate 12, the rotary orbit motor 74 reverses direction and the switch actuator 88 and the eccentric camming member 18 rotate clockwise. The magnetic proximity sensors 100, 102, 104 (now in reverse order) emit PLC recognizable signals indicating counter rotation of the eccentric camming member 18, until it again reaches the position shown in FIG. 2. The magnetic proximity sensors 100, 102, 104 may preferably also issue an LED signal as the switch actuator 88 passes each sensor 100, 102, 104, so that an operator may visually confirm correct sequencing of the bending operation. From the position shown in FIG. 2, the upper split bearings 34. 36, 38, 40, 42, 44 slidingly raise to the position shown in FIGS. 5 and 6, thus completing the full sequence of the bending operation.

It will be, of course, recognized by those of skill in this art that magnetic proximity sensors 100, 102, 104 and PLC controls are well known in the art per se. Suitable magnetic proximity sensors for use in the apparatus and method of this invention are available, for example, from Square D, Groupe Schneider under the trade name XS Tubular, Inductive Proximity sensors.

The edge-bent lithographic plate 12 has leading and tailing plate edges, designated in relation to the rotation of the lithographic plate when installed on a printing cylinder. The edge bends of the lithographic plate may be mirror images of each other or may have any profiles of single or multiple edge bends, such as those illustratively shown in FIG. 10. The eccentric camming surface 18 within the upper bearing mounts 64 are raised to the position shown for example FIG. 6. The lithographic plate tailing edge is advanced over the anvil edge, for example by means of the movable saddle described above, or by any other suitable lateral plate adjustment means. The bending operation is again carried out with a limit of rotation of the camming member 18 limited to define the proper angle bend. Similarly, additional edge bends can be formed to meet the requirement of any particular printing press cylinder.

The adjustability of the bending anvils 14, 16, has been described above with reference to providing stationary and the laterally movable saddles. Another means of providing adjustment of the distance between the anvils 14, 16 to support lithographic plates 12 of various dimensions is described as follows: The plate support surface 148 is shown in FIG. 1. The plate support can alternatively be constructed of a plurality of interconnected articulated slats arranged parallel to and co-planar with the anvil bending edges.

When the anvils 14, 16 are at their farthest distance apart from each other, the plurality of slats together form a table to support the plate 12. The anvils 14, 16 are able to move towards each other by allowing the end slat and the slats successively attached thereto to articulate and suspend below the planar level of the anvils, much in the manner of a rolling tambour surface, as a roll-top desk. Lateral movement of the anvils in this manner allows adjustment of the anvils to the dimensions of a particular lithographic plate, allows positioning of the leading/tailing plate edge for making multiple edge bends, and allows retraction of the anvils for easy removal of the edge-bent plate.

It will be understood by those of skill in this art that the time required for rotation and counter rotation of the eccentric camming member 18 (i.e., the time required for edge bend formation) will be the same regardless of the angle of the bend (i.e., regardless of the extent of the angle through which the camming member 18 must rotate). This is to assure that the time for completing the edge bending operation remains properly sequenced with the corner cutting operation. Thus, when the angle to be formed will be smaller (i.e., more acute), the speed of rotation and counter rotation will accordingly increase.

The entire sequencing operation of the apparatus of this invention may desirably be determined by computerized controls. A suitable computerized control is available from Sophia Antipolis. The hardware includes an operator control panel having a screen displaying up to about eight lines of data, identified as product T CCX 17 20LW, 20FW or 30LW. The application software is identified as TXT L PL7 M17 V52E. Also, the sequencing operation may also be carried out manually.

It is within the concept of the present invention, that the apparatus may be embodied to perform only the bending operation when it may be desirable to configure the plate with only the edge bends. According to the apparatus and method this embodiment, the edge bends may be formed to any desirable angle within the range noted above and each bend may be formed to a different angle as needed.

The present invention is most specifically directed to the configuration of lithographic plates to be installed on printing cylinders. However, it will be obvious to those of skill in this art that the apparatus and the method of the present invention are will adapted to other uses in which edge bending, and optionally corner cutting, of large thin sheets may be desirable.

While some specific embodiments of this invention have been described, it is to be understood that this is for illustration only. Various modifications can be made within the scope of the invention as set forth by the following claims.

That which is claimed is:

1. A plate configuring apparatus for configuring a metal plate having corners and edges comprising:
   a bed to support the plate to be configured;
   a die cutter having means for advancement to an operative position and retraction to an inoperative position above a perimeter of the plate;
   means for the die cutter to make a cut in the plate when in advanced operative position above the plate perimeter;
   an anvil having a bending radius of a preselected angle at an edge of the bed;
   an eccentric camming member having a bending surface positioned relative to the anvil to bend a plate edge around the anvil-bending radius;
   a full bearing supporting ends of the eccentric camming member for rotation;
   an additional bearing intermediate the eccentric camming member ends within which the eccentric camming member is rotatably contained during rotation, supporting radially the eccentric camming member intermediate its length; and
   means for rotating the eccentric camming member around the bending radius of the anvil, a closest point on the bending surface of the eccentric camming member being spaced from the anvil during rotation a distance equal to a thickness of the plate.

2. The plate configuring apparatus of claim 1, in which the eccentric camming member is provided with means to limit rotation around the bending radius of the anvil to bend the plate edge to any pre-defined angle greater than 0° and no greater than the anvil angle.

3. The plate configuring apparatus of claim 1, in which the means for advancement, cutting and retraction of the die cutter and the means for rotation of the eccentric camming member are sequenced, so that advancement, cutting and retraction of the corner die cutter are complete before rotation of the eccentric camming member.

4. The plate configuring apparatus of claim 1, in which the additional bearing comprises a split bearing having an upper bearing carried by an upper bearing mount and a lower bearing carried by a lower bearing mount secured to the bed.

5. The plate configuring apparatus of claim 4, further including means for lowering the upper bearing mount of the eccentric camming member to a position relative to the anvil for bending a plate and further including means for counter-rotating the eccentric camming member and means for raising the upper bearing mount of the eccentric camming member after the plate is bent around the anvil.

6. The plate configuring apparatus of claim 5, in which the means for advancement and retraction of the die cutter are pneumatic, hydraulic or electric and in which the cutting means of the die cutter and the means for raising and lowering the upper bearing mount and the means for rotation and counter rotation of the eccentric camming member are all pneumatic.

7. The plate configuring apparatus of claim 1, in which the means for rotating the eccentric camming member is a rotary orbit motor.

8. The plate configuring apparatus of claim 1, in which the die cutter is positioned adjacent a plate corner and has means for advancement to an operative position and retraction to an inoperative position above a corner of the plate.

9. The plate configuring apparatus of claim 1, in which the die cutter is positioned adjacent an edge of the plate to be bent and the die cutter has means for advancement to an operative position and retraction to an inoperative position above an edge of the plate to be bent.

10. The plate configuring apparatus of claim 6, in which the means for advancement and retraction of the die cutter, the cutting means of the die cutter, the means for raising and lowering the upper bearing mount, and the means for rotation and counter rotation of the eccentric camming member are all controlled by programmable logic control.

11. The plate configuring apparatus of claim 2, wherein the bed has lateral plate adjustment means to position the anvil bending radius with reference to the bent plate edge to allow formation of another bend at the plate edge.

12. The plate configuring apparatus of claim 2, wherein the apparatus has two spaced anvils and each eccentric camming member operatively associated with a first anvil is provided with means independent of another eccentric camming member operatively associated with a second anvil to independently limit rotation around the bending radius of the anvil to independently bend each plate edge to any predefined angle greater than 0° and no greater than the anvil angle.

13. The plate configuring apparatus of claim 1, wherein the apparatus has two spaced anvils and the bed is width-adjustable between the anvils to accommodate different-width plates, to accommodate different plate-widths between bend angles, and to allow retraction of at least one anvil to facilitate plate positioning and removal.

14. The plate configuring apparatus of claim 13, wherein width-adjustability of the bed is provided by linear bearings mounted below a saddle assembly to allow lateral movement of the saddle assembly relative to a stationary saddle at an opposite side of the apparatus.

15. The plate configuring apparatus of claim 13, wherein width-adjustability of the bed is provided by a plate support constructed of a plurality of interconnected articulatable slats arranged parallel to and co-planar with the anvil bending edges, such that, when the anvils are farthest apart, the slats together form a plate support table, and such that articulation of an end slat and successively attached slats suspends the connected slats below the anvils planar level, thus moving the anvils towards each other.

16. A plate configuring apparatus for configuring a metal plate having an image thereon and having four corners and opposing edges comprising:
 a bed to support the plate to be configured;
 four corner die cutters, each having means for advancement to an operative position and retraction to an inoperative position above each respective corner of the plate;
 means for each corner die cutter to cut a corner of the plate when in advanced operative position above the respective plate corner;
 a pair of anvils at opposing ends of the bed, each having a bending radius of a preselected angle at an edge of the bed;
 a pair of eccentric camming members, one associated with each anvil, each eccentric camming member having a bending surface positioned relative to the adjacent anvil to bend a plate edge around the anvil bending radius;
 a full bearing supporting ends of each eccentric camming member for rotation;
 an additional bearing intermediate each eccentric camming member end within which each eccentric camming member is rotatably contained during rotation, supporting radially each eccentric camming member intermediate its length; and
 means for rotating each eccentric camming member around the bending radius of each anvil, a closest point on the bending surface of each eccentric camming member being spaced from the anvil during rotation a distance equal to a thickness of the plate, such that the plate edge is rotated and bent around each anvil.

17. A plate configuring apparatus according to claim 11, in which each eccentric camming member is provided with means to limit rotation around each bending radius of the anvil to independently bend each plate edge to any predefined angle greater than 0° and no greater than the anvil angle.

18. A plate configuring apparatus according to claim 16, in which one anvil is retractable for removing the plate from the bed.

19. A plate configuring apparatus according to claim 16, in which the means for advancement, cutting and retraction of the corner die cutter and the means for rotation of the eccentric camming member are sequenced by programmable logic control, so that advancement, cutting and retraction of the corner die cutter are complete before rotation of the eccentric camming member.

20. The plate configuring apparatus of claim 17, wherein the bed has lateral plate adjustment means to position an anvil bending radius with reference to a bent plate edge to allow formation of another bend at the plate edge.

21. The plate configuring apparatus of claim 16, wherein the bed is width-adjustable between the anvils to accommodate different-width plates, to accommodate different plate-widths between bend angles, and to facilitate plate positioning and removal and different plate-widths between bend angles.

22. The plate configuring apparatus of claim 21, wherein width-adjustability of the bed is provided by linear bearings mounted below a saddle assembly to allow lateral movement of the saddle assembly relative to a stationary saddle at an opposite side of the apparatus.

23. The plate configuring apparatus of claim 21, wherein width-adjustability of the bed is provided by a plate support constructed of a plurality of interconnected articulated slats arranged parallel to and co-planar with the anvil bending edges.

24. A method of configuring a metal plate having corners and edges, the method comprising:
   positioning the metal plate on a support bed, the bed having an anvil with a bending radius of a preselected angle at an edge of the bed;
   advancing a die cutter to an operative position above a perimeter of the plate;
   actuating the die cutter to make a cut in the plate;
   retracting the die cutter to an inoperative position above the plate;
   positioning an eccentric camming member at a position relative to the anvil for bending a plate edge, the camming member having a bending surface for bending the plate edge around the bending radius of the anvil, the camming member having a full bearing supporting ends of the camming member for rotation, the camming member having an additional bearing intermediate ends of the camming member within which the camming member is rotatably contained during rotation, radially supporting the camming member intermediate its length; and
   rotating the camming member around the bending radius of the anvil, while maintaining a closest point on the bending surface of the camming member spaced from the anvil during rotation a distance equal to a thickness of the plate.

25. A method according to claim 24 in which the additional bearing comprises a split bearing having an upper bearing carried by an upper bearing mount and a lower bearing carried by a lower bearing mount secured to the bed.

26. A method according to claim 25 and further including:
   before rotating the camming member, lowering the upper bearing mount to a position relative to the anvil for bending a plate; and
   further including, after rotating the camming member, counter-rotating the camming member and raising the upper bearing mount of the camming member after the plate is bent around the anvil.

27. A method according to claim 24, in which the camming member bends the plate around the anvil to any pre-defined angle greater than 0° and no greater than the anvil angle.

28. A method according to claim 24, in which the die cutter is advanced into an elevation between the bed and the raised camming member.

29. A method according to claim 24, in which the angle of bend of the plate is determined by adjusting a limit of rotation of the camming member.

30. A method according to claim 27, including providing the bed with lateral plate adjustment means, positioning the anvil bending radius with reference to the bent plate edge, and forming another bend at the plate edge.

31. The method according to claim 27, wherein the apparatus has two spaced anvils and each camming member is provided with means independent of another camming member to independently limit rotation around the bending radius of the anvil to independently bend each plate edge to any pre-defined angle greater than 0° and no greater than the anvil angle.

32. A method according to claim 24, including providing a pair of spaced anvils and including means for adjusting the width of the bed between the anvils to accommodate different-width plates, to accommodate different plate-widths between bend angles, and to facilitate plate positioning and removal and different plate-widths between bend angles.

33. A method according to claim 32, wherein the means for adjusting the width of the bed between the anvils comprises linear bearings mounted below a saddle assembly to allow lateral movement of the saddle assembly relative to a stationary saddle at an opposite side of the apparatus.

34. A method according to claim 32, wherein the means for adjusting the width of the bed is provided by a plate support constructed of a plurality of interconnected articulated slats arranged parallel to and co-planar with the anvil bending edges, such that, when the anvils are farthest apart, the slats together form a plate support table, and such that articulation of an end slate and successively attached slats suspends the connected slats below the anvils planar level, thus moving the anvils towards each other.

35. A method of configuring a metal plate having opposing edges, the method comprising:
   positioning the metal plate on a support bed, the bed having an anvil with a bending radius of a preselected angle at an edge of the bed;
   providing an eccentric camming member having a bending surface positioned relative to the anvil to bend one edge of the plate around the bending radius of the anvil;
   providing a full bearing supporting each end of the camming member for rotation;
   providing an additional bearing intermediate the ends of the camming member within which the camming member is rotatably contained during rotation, supporting radially the camming member intermediate its length; and
   rotating the camming member around the bending radius of the anvil, a closest point on the bending surface of the camming member being spaced from the anvil during rotation a distance equal to a thickness of the plate being bent;
   so that the plate edge is rotated and bent around the anvil to any pre-defined angle greater than 0° and less than the anvil angle and so that the thickness of the plate throughout, including the plate bend, is uniform.

36. A method according to claim 35, in which:
   two anvils are provided at opposing ends of the bed;
   a camming member is operatively associated with each anvil;
   so that opposing edges of the plate are each rotated and bent around the anvil, each independently to any pre-defined angle greater than 0° and less than the anvil angle.

37. A method according to claim 35 in which the angle of bend of the plate is determined by adjusting a limit of rotation of the camming member.

38. A method according to claim 35, including providing the bed with lateral plate adjustment means, positioning an anvil bending radius with reference to a bent plate edge, and forming another bend at the plate edge.

39. A method according to claim 36, wherein the means for adjusting the width of the bed between the anvils comprises linear bearings mounted below a saddle assembly to allow lateral movement of the saddle assembly relative to a stationary saddle at an opposite side of the apparatus.

40. A method according to claim 36, wherein the means for adjusting the width of the bed is provided by a plate support constructed of a plurality of interconnected articulated slats arranged parallel to and co-planar with the anvil bending edges, such that, when the anvils are farthest apart, the slats together form a plate support table, and such that articulation of an end slate and successively attached slats suspends the connected slats below the anvils planar level, thus moving the anvils towards each other.

41. A plate configuring apparatus for configuring a metal plate having corners and edges comprising:

a bed to support the plate to be configured;

a cutter having means for advancement to an operative position and retraction to an inoperative position above a perimeter of the plate;

means for the cutter to make a cut in the plate when in advanced position above the plate perimeter;

an anvil having a bending radius of a preselected angle at an edge of the bed;

a bending member having a bending surface positioned relative to the anvil to bend a plate edge around the anvil-bending radius; and means for rotating the bending member around the bending radius of the anvil, a closest point on the bending surface of the bending member being spaced from the anvil during rotation a distance equal to a thickness of the plate.

42. The plate configuring apparatus of claim 41, wherein the apparatus has two spaced anvils and the bed is width-adjustable between the anvils to accommodate different-width plates, to accommodate different plate-widths between bend angles, and to facilitate plate positioning and removal and different plate-widths between bend angles.

43. The plate configuring apparatus of claim 42, wherein width-adjustability of the bed is provided by linear bearings mounted below a saddle assembly to allow lateral movement of the saddle assembly relative to a stationary saddle at an opposite side of the apparatus.

44. The plate configuring apparatus of claim 42, wherein width-adjustability of the bed is provided by a plate support constructed of a plurality of interconnected articulated slats arranged parallel to and co-planar with the anvil bending edges, such that, when the anvils are farthest apart, the slats together form a plate support table, and such that articulation of an end slate and successively attached slats suspends the connected slats below the anvils planar level, thus moving the anvils towards each other.

45. The plate configuring apparatus of claim 41, in which the means for rotating the bending member is provided with means to limit rotation around the bending radius of the anvil to bend the plate edge to any pre-defined angle greater than 0° and no greater than the anvil angle.

46. The plate configuring apparatus of claim 45, wherein the bed has lateral plate adjustment means to position the anvil bending radius with reference to the bent plate edge to allow formation of another bend at the plate edge.

47. The plate configuring apparatus of claim 45, wherein the apparatus has two spaced anvils and each means for rotating the bending member operatively associated with a first anvil is provided with means independent of another means for rotating the bending member operatively associated with a second anvil to independently limit rotation around the bending radius of the anvil to independently bend each plate edge to any pre-defined angle greater than 0° and no greater than the anvil angle.

48. A plate configuring apparatus for configuring a metal plate having corners and edges comprising:

a bed to support the plate to be configured;

an anvil having a bending radius of a preselected angle at an edge of the bed;

a bending member having a bending surface positioned relative to the anvil to bend a plate edge around the anvil-bending radius; and means for rotating the bending member around the bending radius of the anvil, a closest point on the bending surface of the bending member being spaced from the anvil during rotation a distance equal to a thickness of the plate, the bending member provided with means to limit rotation around the bending radius of the anvil to bend the plate edge to any pre-defined angle greater than 0° and less than the anvil angle.

49. An apparatus according to claim 48, wherein the bed is provided with lateral plate adjustment means designed and adapted to position an anvil bending radius with reference to a bent plate edge to form another bend at the plate edge.

50. An apparatus according to claim 48, wherein:

two anvils are provided at opposing ends of the bed;

a bending member is operatively associated with each anvil, designed and adapted to rotate and bend opposing edges of the plate around each anvil, each independently to any predefined angle greater than 0° and less than the anvil angle.

51. An apparatus according to claim 50, wherein the bed is provided with means for adjusting the width of the bed between the anvils to accommodate different-width plates, to accommodate different plate-widths between bend angles, and to facilitate plate positioning and removal and different plate-widths between bend angles.

52. An apparatus according to claim 51, wherein the means for adjusting the width of the bed between the anvils comprises linear bearings mounted below a saddle assembly to allow lateral movement of the saddle assembly relative to a stationary saddle at an opposite side of the apparatus.

53. An apparatus according to claim 51, wherein the means for adjusting the width of the bed is provided by a plate support constructed of a plurality of interconnected articulated slats arranged parallel to and co-planar with the anvil bending edges, such that, when the anvils are farthest apart, the slats together form a plate support table, and such that articulation of an end slate and successively attached slats suspends the connected slats below the anvils planar level, thus moving the anvils towards each other.

* * * * *

UNITED STATES PATENT AND TRADEMARK OFFICE
CERTIFICATE OF CORRECTION

PATENT NO. : 5,970,774
DATED : October 26, 1999
INVENTOR(S) : Dennis M. Burgess; William J. Campbell, and Mark L. Palmer It is certified that error appears in the above-identified patent and that said Letters Patent is hereby corrected as shown below:

On the title page, please delete the first name of the Attorney and insert the correct name, Malcolm.

Under Background of the Invention, column 2, line 17, delete "r place" and insert --replace--.

Under Brief Description of the Drawings, column 5, line 14, delete "bonds" and insert --bends--.

Under Detailed Description of the Invention, column 7, line 44, delete "bearing" and insert --bearings--.

Signed and Sealed this

Second Day of May, 2000

Attest:

Q. TODD DICKINSON

*Attesting Officer*   *Director of Patents and Trademarks*